(12) United States Patent
Butler et al.

(10) Patent No.: US 11,561,479 B2
(45) Date of Patent: Jan. 24, 2023

(54) ELECTRONIC SYSTEM, ACCELEROMETER, CALIBRATION METHOD, LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Bas Jansen, Den Bosch (NL); Cornelius Adrianus Lambertus De Hoon, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/428,223

(22) PCT Filed: Jan. 3, 2020

(86) PCT No.: PCT/EP2020/050051
§ 371 (c)(1),
(2) Date: Aug. 3, 2021

(87) PCT Pub. No.: WO2020/160852
PCT Pub. Date: Aug. 13, 2020

(65) Prior Publication Data
US 2022/0113636 A1      Apr. 14, 2022

(30) Foreign Application Priority Data

Feb. 4, 2019    (EP) ..................... 19155204

(51) Int. Cl.
*G03F 7/20* (2006.01)
*G01D 3/032* (2006.01)
(Continued)

(52) U.S. Cl.
CPC ......... *G03F 7/70516* (2013.01); *G01D 3/032* (2013.01); *G01P 15/09* (2013.01);
(Continued)

(58) Field of Classification Search
CPC ............. G03F 7/70516; G03F 7/70775; G03F 7/7085; G03F 7/70725; G03F 7/709;
(Continued)

(56) References Cited

U.S. PATENT DOCUMENTS

| 2,904,681 | A |   | 9/1959  | Jones, Jr. et al. |
| 3,349,629 | A | * | 10/1967 | Elazar ...................... G01L 1/16 310/329 |

(Continued)

FOREIGN PATENT DOCUMENTS

| EP | 1 271 248 A1 | 1/2003 |
| EP | 2 778 632 A2 | 9/2014 |

(Continued)

OTHER PUBLICATIONS

International Search Report and Written Opinion of the International Searching Authority directed to related International Patent Application No. PCT/EP2020/050051, dated Apr. 3, 2020; 12 pages.

(Continued)

*Primary Examiner* — Christina A Riddle
(74) *Attorney, Agent, or Firm* — Sterne, Kessler, Goldstein & Fox P.L.L.C.

(57) ABSTRACT

The invention relates to an electronic system for an accelerometer having a piezoelectric element and a first mechanical resonance frequency, comprising: a) a damping circuit configured to: —receive an acceleration signal from the piezoelectric element; —electronically dampen an amplitude of the first mechanical resonance frequency; and—generate a damped acceleration signal, b) an extender configured to: —receive the damped acceleration signal; —extend the frequency response; and—output an extended damped acceleration signal, wherein the extender is configured to have a first electronic anti-resonance frequency (Continued)

matching the damped first mechanical resonance frequency, and to have a frequency response between the first electronic anti-resonance frequency and a higher second frequency that is substantially opposite to a corresponding frequency response of the combination of the accelerometer and the damping circuit.

15 Claims, 4 Drawing Sheets

(51) Int. Cl.
 *G01P 15/09* (2006.01)
 *G01P 21/00* (2006.01)
(52) U.S. Cl.
 CPC ............ *G03F 7/709* (2013.01); *G03F 7/7085* (2013.01); *G03F 7/70775* (2013.01); *G01P 21/00* (2013.01)
(58) Field of Classification Search
 CPC .. G03F 7/70691; G03F 7/708; G03F 7/70808; G03F 7/70825; G03F 7/70833; G03F 7/70858; G03F 7/70975; G03F 7/70991; G03F 7/70483; G03F 7/70491; G03F 7/70508; G01D 3/032; G01D 3/028–0365; G01P 15/00; G01P 15/08; G01P 15/0802; G01P 15/09–0922; G01P 15/097–10; G01P 15/12; G01P 15/123; G01P 15/125; G01P 15/133; G01P 15/18; G01P 21/00
 USPC ...................... 355/18, 30, 52–55, 67–77, 133
 See application file for complete search history.

(56) References Cited

U.S. PATENT DOCUMENTS

| | | | |
|---|---|---|---|
| 4,197,478 A | * | 4/1980 | Silvus, Jr. ............. G01P 15/097 310/317 |
| 4,219,767 A | | 8/1980 | Wimmer |
| 6,763,726 B2 | | 7/2004 | Yamashita |
| 6,912,041 B2 | | 6/2005 | Butler et al. |
| 7,715,949 B2 | | 5/2010 | Sato et al. |
| 9,435,821 B1 | | 9/2016 | Tucker et al. |
| 2006/0017908 A1 | | 1/2006 | Mayama |
| 2013/0162365 A1 | | 6/2013 | Otaguro et al. |
| 2014/0238662 A1 | * | 8/2014 | Prieto .................. F16F 15/005 166/66.5 |
| 2015/0027199 A1 | * | 1/2015 | Sarma ..................... G01P 21/00 73/1.37 |
| 2015/0331009 A1 | | 11/2015 | Galdos et al. |
| 2017/0349271 A1 | | 12/2017 | Inquiete et al. |
| 2018/0367067 A1 | * | 12/2018 | Yang ................... H02K 41/031 |

FOREIGN PATENT DOCUMENTS

| | | |
|---|---|---|
| JP | S59-163523 A | 9/1984 |
| JP | H05-232133 A | 9/1993 |
| JP | H07-113816 A | 5/1995 |
| JP | 2003-109898 A | 4/2003 |
| JP | 2003-254991 A | 9/2003 |
| JP | 2003-315356 A | 11/2003 |
| JP | 2006-032788 A | 2/2006 |
| JP | 2008-134996 A | 6/2008 |

OTHER PUBLICATIONS

Japanese Search Report directed to related Japanese Patent Application No. 2021-545461, dated Jul. 28, 2022; 49 pages.

* cited by examiner

ELECTRONIC SYSTEM, ACCELEROMETER, CALIBRATION METHOD, LITHOGRAPHIC APPARATUS AND DEVICE MANUFACTURING METHOD

CROSS-REFERENCE TO RELATED APPLICATIONS

This application claims priority of EP application 19155204.1 which was filed on Feb. 4, 2019 and which is incorporated herein in its entirety by reference.

BACKGROUND

Field of the Invention

The present invention relates to an electronic system for an accelerometer, an accelerometer including such an electronic system, calibration methods for the electronic system of the accelerometer, a lithographic apparatus, and a device manufacturing method using a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, accurate and low-noise measurements of a position, orientation, velocity, acceleration and/or jerk of an object of the lithographic apparatus may be required, e.g. for active damping and/or diagnostic purposes. The object of the lithographic apparatus may for instance be a support constructed to support the patterning device, a substrate table constructed to hold the substrate, an element of the projection system and/or frame members of measurement frames or support frames.

To measure acceleration, low-noise piezoelectric accelerometers can be used, which are typically relatively large and suffering from a relatively low first mechanical resonance frequency, limiting their useful frequency range.

An obvious solution to extend the useful frequency range may be to increase the first mechanical resonance frequency by lowering the mass used in the accelerometer. However, although the smaller accelerometer has the advantage of a larger useful frequency range, the byproduct is a significant higher noise.

SUMMARY

It is desirable to provide an accelerometer allowing low-noise measurements over an extended frequency range.

According to an embodiment of the invention, there is provided an electronic system for an accelerometer having a piezoelectric element and a first mechanical resonance frequency, comprising:
a) a damping circuit configured to:
  receive an acceleration signal from the piezoelectric element;
  electronically dampen an amplitude of the first mechanical resonance frequency; and
  generate a damped acceleration signal,
b) an extender configured to:
  receive the damped acceleration signal;
  extend the frequency response; and
  output an extended damped acceleration signal,
wherein the extender is configured to have a first electronic anti-resonance frequency matching the damped first mechanical resonance frequency, and to have a frequency response between the first electronic anti-resonance frequency and a higher second frequency that is substantially opposite to a corresponding frequency response of the combination of the accelerometer and the damping circuit.

According to another embodiment of the invention, there is provided an accelerometer comprising a mass, a piezoelectric element connected to the mass, and an electronic system connected to the piezoelectric element, wherein the accelerometer has a first mechanical resonance frequency, wherein the electronic system includes:
a) a damping circuit configured to:
  receive an acceleration signal from the piezoelectric element;
  electronically dampen an amplitude of the first mechanical resonance frequency; and
  generate a damped acceleration signal,
b) an extender configured to:
  receive the damped acceleration signal;
  extend the frequency response; and
  output an extended damped acceleration signal,
wherein the extender is configured to have a first electronic anti-resonance frequency matching the damped first mechanical resonance frequency, and to have a frequency response between the first electronic anti-resonance frequency and a higher second frequency that is substantially opposite to a corresponding frequency response of the combination of the accelerometer and the damping circuit.

According to a further embodiment of the invention, there is provided a method to calibrate an electronic system of an accelerometer according to the invention, comprising the following steps:
a. measuring an actual frequency response of the damped acceleration signal;
b. comparing the actual frequency response with a desired frequency response;
c. based on an outcome of step b., determining values of extender settings to obtain the desired frequency response with the extended damped accelerometer signal; and
d. setting the extender settings to the determined values.

According to yet another embodiment of the invention, there is provided a method to calibrate an accelerometer including an electronic system according to the invention, wherein the damping circuit includes a resistor and an inductor connected in series with the piezoelectric element to form a resistor-inductor-capacitor circuit with a capacitance of the piezoelectric element, comprising the following steps:

a. measuring the first mechanical resonance frequency and its amplitude;
b. determining values for the resistor and inductor of the resistor-inductor-capacitor circuit to dampen the first mechanical resonance frequency to a desired level; and
c. setting the resistor and inductor to the determined values.

According to a further embodiment of the invention, there is provided a measurement system including an accelerometer according to the invention.

According to another embodiment of the invention, there is provided a lithographic apparatus comprising:

an actuation system to position an object;
a measurement system to measure a position quantity of the object; and
a control system to control the actuation system based on an output of the measurement system, wherein the measurement system includes an accelerometer according to the invention.

According to a further embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
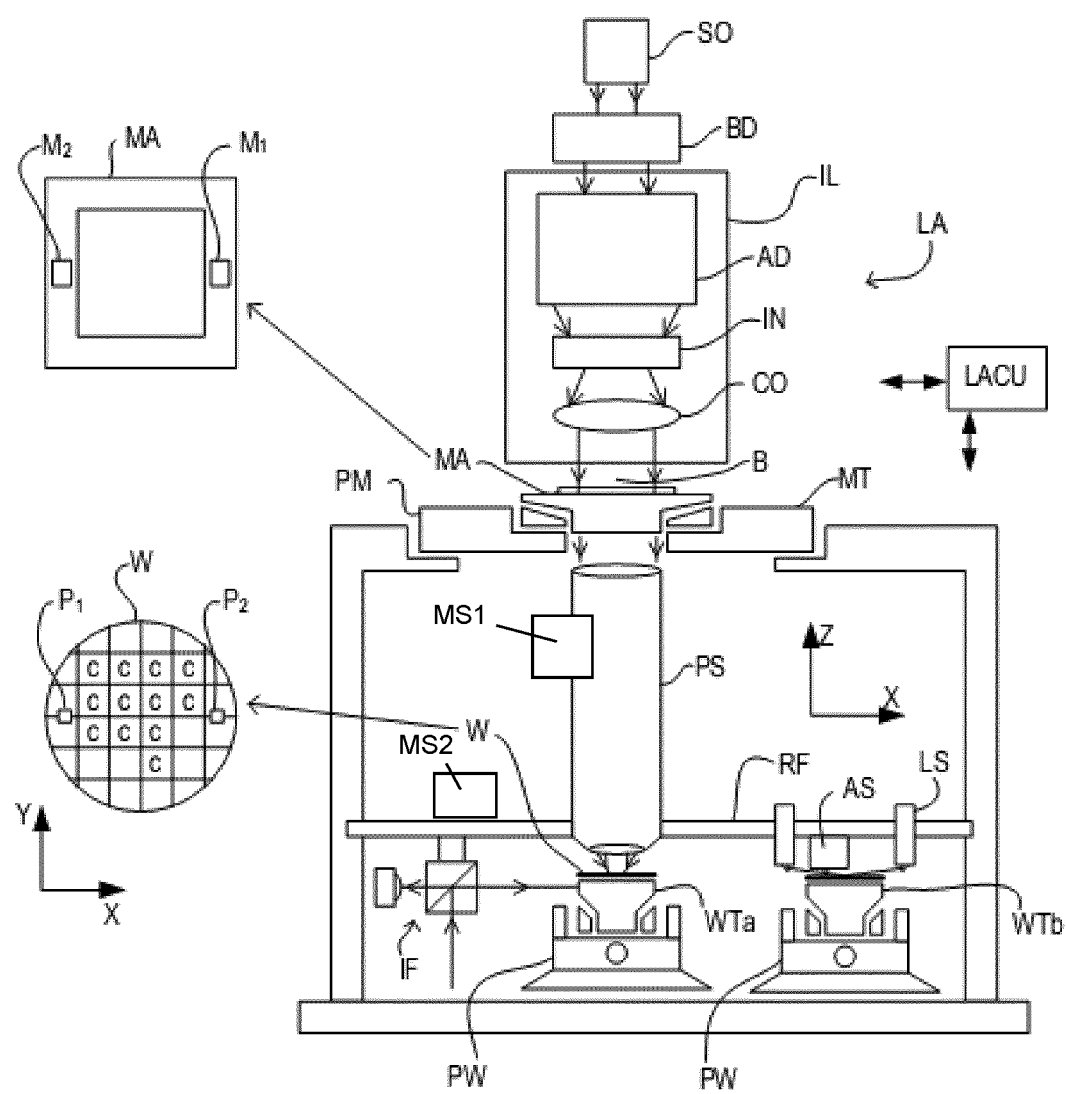
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WTa or WTb constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "radiation" and "beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD comprising, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks M1, M2 may be located between the dies.

The depicted apparatus can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:
1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

The lithographic apparatus may further include measurement systems to measure a position, velocity, acceleration and/or jerk of objects within the lithographic apparatus. In the example shown in FIG. 1, a first measurement system MS1 is depicted to measure a position quantity such as relative or absolute position, velocity, acceleration and/or jerk of an element of the projection system PS. A second measurement system MS2 is depicted to measure a position quantity, e.g. a relative or absolute position, velocity, acceleration and/or jerk, of a frame of the lithographic apparatus.

The first and second measurement system MS1, MS2 may for instance be used for active damping. The measurement signals are in that case provided to a control system, e.g. control unit LACU, allowing the control system to control an actuation system based on the measurement signals. The actuation system may be controlled to position the object such that for instance disturbances are compensated and/or vibrational movements are reduced.

Alternatively or additionally, the first and second measurement system MS1, MS2 may be used for diagnostic purposes.

Independent of the application of the first and second measurement system MS1, MS2, said measurement systems may include an accelerometer according to an embodiment of the invention as will be described below.

Figure 2:
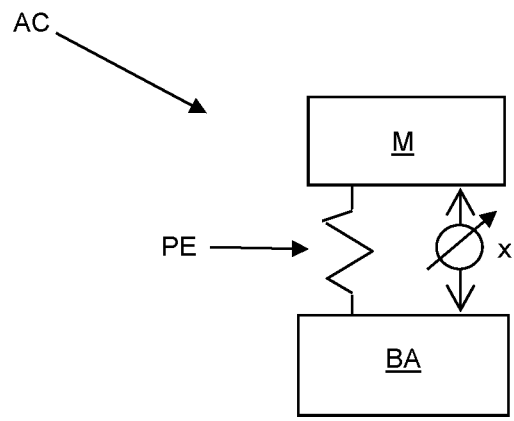
FIG. 2 schematically depicts an accelerometer according to an embodiment of the invention.

FIG. 2 schematically depicts an accelerometer AC according to an embodiment of the invention. The accelerometer AC comprises a mass M and a base BA that are connected to each other via a piezoelectric element PE symbolically indicated by a spring element. The piezoelectric element PE creates an acceleration signal which is representative for the relative displacement x of mass M with respect to the base BA. Due to the piezoelectric element having substantially the characteristic of a spring, a first mechanical resonance frequency exists at a frequency equal to $\omega=\sqrt{(k/m)}$. The displacement x is proportional to the acceleration of the base BA substantially up to this first mechanical resonance frequency. Because of this proportionality, the frequency range up to this first mechanical resonance frequency may be referred to as the useful frequency range. Within the context of this description, extending the frequency response thus refers to increasing the frequency range where this proportionality exists, i.e. thus refers to extending the useful frequency range.

Figure 3:
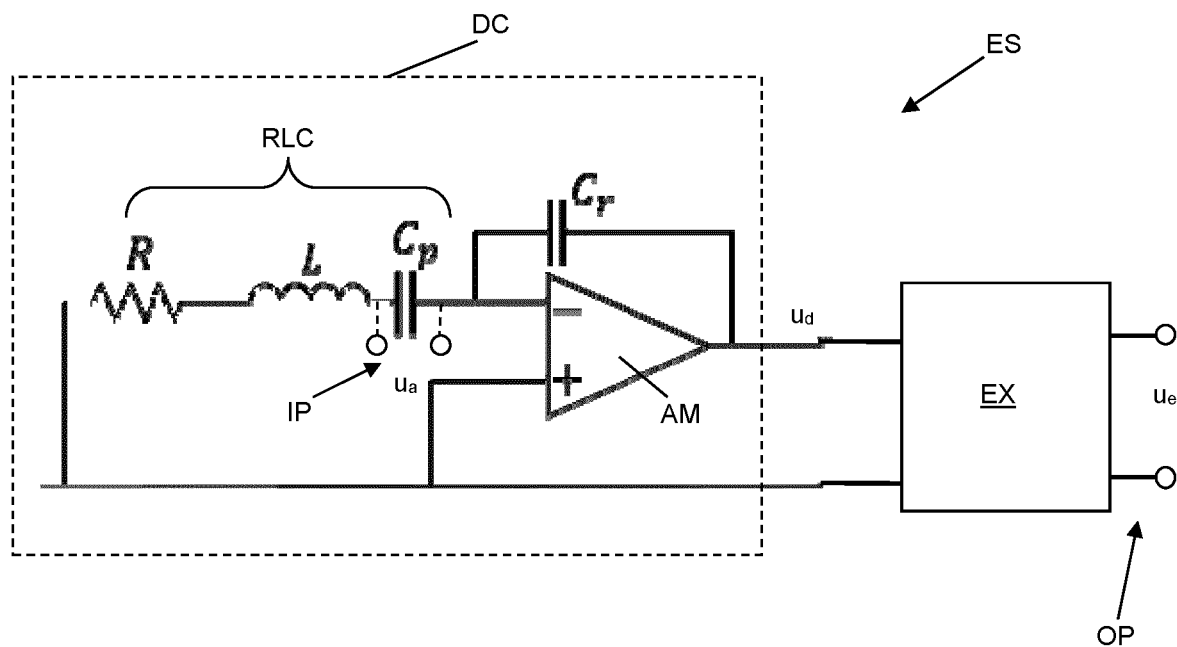
FIG. 3 schematically depicts an electronic system according to an embodiment of the invention.

FIG. 3 schematically depicts an electronic system ES according to an embodiment of the invention that can be used to output a measurement signal based on an acceleration signal of the piezoelectric element of the accelerometer of FIG. 2. The piezoelectric element PE has a capacitance, that is indicated in FIG. 3 as capacitance Cp, so that the acceleration signal provided by the piezoelectric element PE is the signal $u_a$ over the capacitance Cp. The acceleration signal $u_a$ represents a voltage over the piezoelectric element PE or a charge stored in the piezoelectric element PE.

The electronic system ES includes a damping circuit DC and an extender EX arranged in series. The damping circuit is configured to receive the acceleration signal $u_a$ from the piezoelectric element PE. The function of the damping circuit DC is to electronically dampen an amplitude of a first mechanical resonance frequency of the accelerometer, and to generate a damped acceleration signal $u_d$.

In the embodiment of FIG. 3, damping of the amplitude of the first mechanical resonance frequency is achieved by connecting a resistor R and an inductor L in series with the piezoelectric element PE to form a resistor-inductor-capacitor circuit RLC with the capacitance Cp of the piezoelectric element PE. By matching the electronic resonance frequency of the resistor-inductor-capacitor circuit RLC to the first mechanical resonance frequency, the amplitude of the first mechanical resonance frequency in the damped acceleration signal $u_d$ is reduced with respect to the amplitude of the first mechanical resonance frequency in the acceleration signal $u_a$.

The damping circuit DC further includes a capacitor Cr and an amplifier AM to amplify the acceleration signal. It is explicitly noted that FIG. 3 is a schematic representation of the embodiment. In practice, the electronic system may include additional or equivalent electric components to process the acceleration signal as is known in the art of signal processing.

The extender EX is configured to receive the damped acceleration signal $u_d$, to extend the frequency response, and to output an extended damped acceleration signal $u_e$. To this end, the extender is configured to have a first electronic anti-resonance frequency matching the damped first mechanical resonance frequency, and to have a frequency response between the first electronic anti-resonance frequency and a higher second frequency that is substantially opposite to a corresponding frequency response of the combination of the accelerometer and the damping circuit. As a result thereof, the frequency range in which the extended damped acceleration signal $u_e$ is substantially proportional to acceleration of the base BA of FIG. 2 is larger than the frequency range in which the acceleration signal $u_a$ is substantially proportional to the acceleration of the base BA of FIG. 2. In other words, the frequency response of the accelerometer has been extended.

An advantage of the electronic system ES of FIG. 3 is that the frequency response is extended without having to adjust or alter the accelerometer itself. Hence, compared to an obvious solution in which the frequency response is extended by lowering the mass of mass M, the frequency response is now extended while keeping the good characteristics associated with a relatively large/heavy accelerometer. These good characteristics in principle outweigh the possible introduction of noise by the extender EX at higher frequencies, so that even after extending the frequency response the noise level is better than that of a corresponding smaller accelerometer.

Another advantage of the electronic system ES of FIG. 3 is that when a plurality of similar accelerometers are used, i.e. having substantially the same mass M, substantially the same piezoelectric element, and thus a similar first mechanical resonance frequency, similar electronic systems ES can be used for each accelerometer in which the damping system is matched/tuned to the particular values of the accelerometer, which may vary slightly due to fabrication tolerances, etc., to provide a well-defined amplitude of the damped acceleration signal over all accelerometers, so that identical extenders can be used for all electronic systems saving calibration time.

In other words, a measurement system may be provided with a first accelerometer according to an embodiment of the invention and a second accelerometer according to an embodiment of the invention, wherein the first and second accelerometer substantially have the same mass, the same piezoelectric element and a similar first mechanical resonance frequency, wherein the electronic systems of the first and second accelerometer include an identical extender, and wherein the damping circuit of the electronic systems of the first and second accelerometers have been tuned to the particular values of the first mechanical resonance frequency and its amplitude.

A further advantage of the electronic system of FIG. 3 is that the damping circuit DC can be relatively simple, as for instance shown in FIG. 3, utilizing the fact that the piezoelectric element PE can simultaneously be used as an actuator to dampen the first mechanical resonance frequency.

Figure 4:
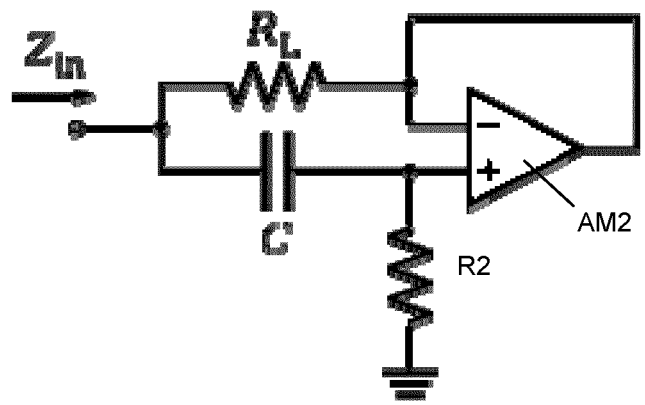
FIG. 4 schematically depicts a Gyrator circuit that can be used in the electronic system of FIG. 3.

In practice, when matching the electronic resonance frequency of the resistor-inductor-capacitor circuit RLC to the first mechanical resonance frequency requires a relatively large value for the inductor, a coil-wound inductor may become unfeasible or undesired. In an embodiment, the inductor L in FIG. 3 is replaced by a so-called Gyrator circuit as shown in FIG. 4 allowing to create an impedance equal to a large inductance. The Gyrator circuit includes an amplifier AM2, two resistors RL, R2 and a capacitor C connected to each other as shown in FIG. 4, so that an inductor value of RL*R2*C can be obtained.

Figure 5:
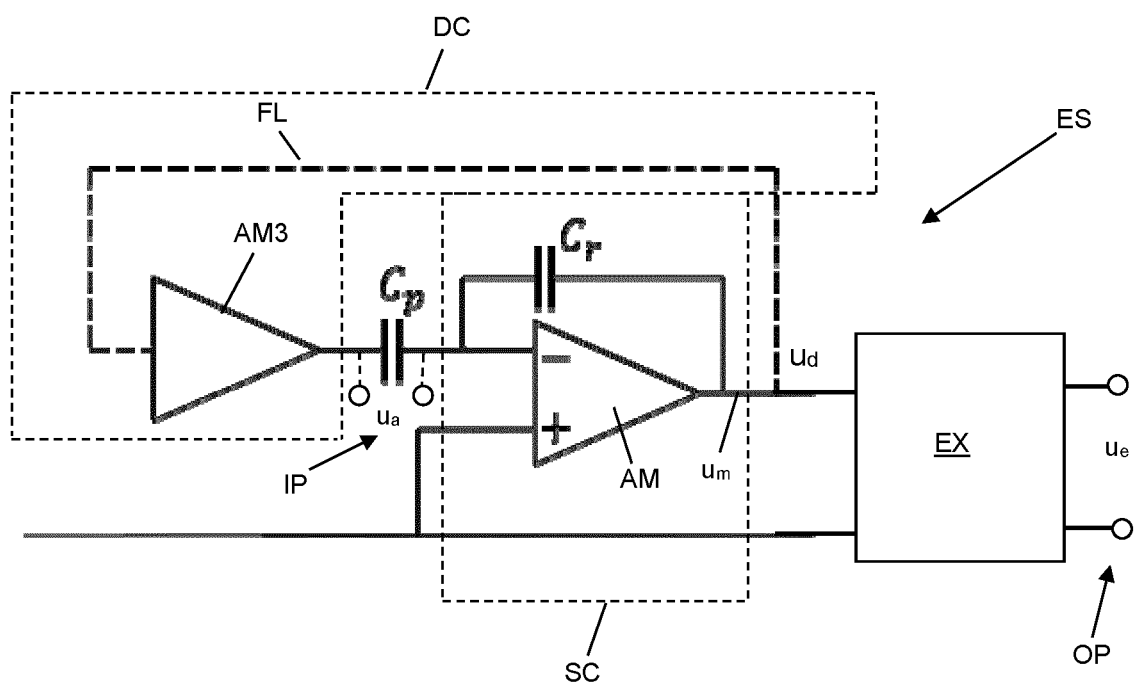
FIG. 5 schematically depicts an electronic system according to another embodiment of the invention.

FIG. 5 schematically depicts an electronic system ES for an accelerometer as shown in FIG. 2 according to another embodiment of the invention. Again the capacitance of the piezoelectric element PE is indicated using capacitor Cp, so that the acceleration signal provided by the piezoelectric element PE is the signal $u_a$ over the capacitance Cp.

The electronic system ES includes a sensor circuit SC including an amplifier AM and a capacitor Cr. The sensor circuit SC is configured to receive the acceleration signal $u_a$ and in this embodiment amplifies the signal to provide a measurement signal $u_m$. It is noted that the sensor circuit is depicted highly schematically and may include other components to process the acceleration signal $u_a$.

The electronic system ES further includes a damping circuit DC, which damping circuit DC includes a feedback loop FL with an amplifier AM3 applying a voltage to the piezoelectric element based on the measurement signal $u_m$ to electronically dampen the amplitude of the first mechanical resonance frequency. Here, again, it is noted that the damping circuit may include additional and/or alternative components to the amplifier AM3 to provide the desired feedback to dampen the first mechanical resonance frequency depending on requirements and practical considerations.

An advantage of the electronic system ES according to the embodiment of FIG. 5 is that the damping circuit DC is less sensitive to variations in the specific values of the piezoelectric element PE and the mass M, so that a similar or even identical damping circuit DC can be used for a plurality of accelerometers without having to worry about mutual variations due to fabrication tolerances and/or drifting properties of the accelerometers over time. The damping circuit DC will in any case provide a damped acceleration signal $u_a$ that is substantially similar to each other allowing again to use the same extenders as described in relation to FIG. 3.

The extender EX in the embodiment of FIG. 3 and FIG. 5 have a similar function and may be analogue, digital or a combination thereof. Hence, in an embodiment, the extender EX includes one or more analogue filters, one or more digital filters or a combination of one or more analogue filters and one or more digital filters.

Figure 6:
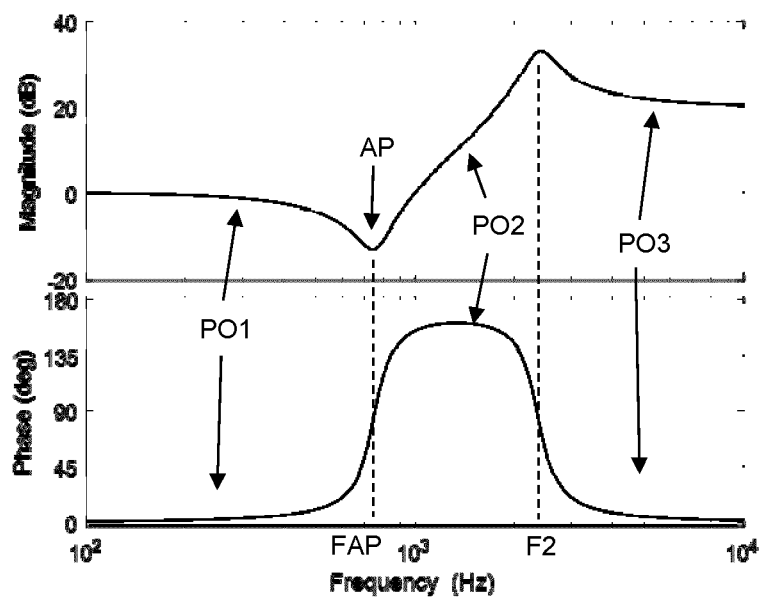
FIG. 6 schematically depicts a possible frequency response of an extender of an electronic system according to the invention.

FIG. 6 depicts the frequency response of an exemplary extender that can be used in the electronic system according to the invention. The frequency response shows a more or less proportional portion PO1, which may alternatively be referred to as a substantially flat response, at low frequencies, which is advantageous, because in that case the extender will have minimal influence on the low-frequency response of the accelerometer.

The frequency response further shows an anti-resonance peak AP at a first electronic anti-resonance frequency FAP to substantially compensate the damped first mechanical resonance peak of the accelerometer. The frequency response of a second portion PO2 between the first electronic anti-resonance frequency FAP and a second higher frequency F2 is substantially opposite to a corresponding frequency response of the damped acceleration signal. In this embodiment, a third portion PO3 of the frequency response above the second frequency F2 is again proportional, i.e. flat, and may eventually slope down to zero to avoid too much introduction of noise. However, the actual frequency response of the third portion PO3 is less relevant or not relevant at all for the application of the invention.

Figure 7:
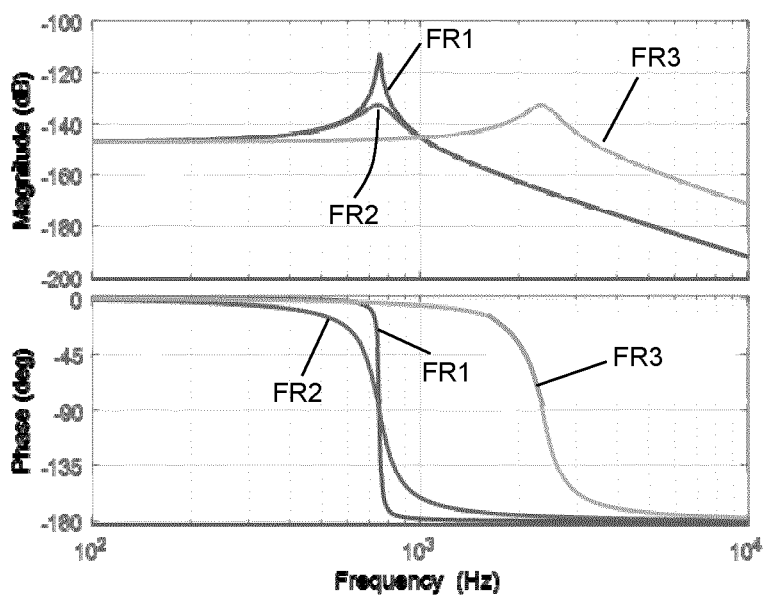
FIG. 7 schematically depicts frequency responses of the acceleration signal, the damped acceleration signal and the extended damped acceleration signal in a practical example.

FIG. 7 schematically depicts three frequency responses showing the effect of the electronic system ES according to the invention on the acceleration signal of an accelerometer. A first frequency response FR1 shows the frequency response of the acceleration signal using a conventional sensor circuit without damping and extending of the frequency response. The first mechanical resonance frequency and corresponding peak are clearly distinguishable.

A second frequency response FR2 shows the effect of using a damping circuit DC according to an embodiment of the invention. As can be seen, the amplitude at the first mechanical resonance frequency has been reduced, preferably to a well-defined value.

A third frequency response FR3 shows the application of an extender having a frequency response as shown in FIG. 7 to the damped acceleration signal with the first electronic anti-resonance frequency being matched to the first mechanical resonance frequency. The result is a frequency response with a first damped resonance at the second frequency F2 and a proportional, i.e. flat, portion at lower frequencies, thereby extending the frequency response of the accelerometer without having to alter, replace or adjust the accelerometer mechanically.

Although not necessary per se for the application of the invention, the electronic system ES may include an input, see input IP in FIGS. 3 and 5, to be connected to the piezoelectric element to receive the acceleration signal $u_a$. Similarly, the electronic system ES may include an output, see output OP in FIGS. 3 and 5, to output the extended damped acceleration signal or a signal corresponding thereto.

According to an embodiment, the following method may be used to calibrate an electronic system ES as shown in FIGS. 3 and 5:
  a. measuring an actual frequency response of the damped acceleration signal $u_d$;
  b. comparing the actual frequency response with a desired frequency response;
  c. based on an outcome of step b., determining values of extender settings to obtain the desired frequency response with the extended damped accelerometer signal $u_e$; and
  d. setting the extender settings to the determined values.

According to an embodiment, the following method may be used to calibrate an electronic system ES as shown in FIG. 3:
  a. measuring the first mechanical resonance frequency and its amplitude;
  b. determining values for the resistor and inductor of the resistor-inductor-capacitor circuit to dampen the first mechanical resonance frequency to a desired level; and
  c. setting the resistor and inductor to the determined values.

In an embodiment, for a measurement system including a plurality of similar accelerometers according to the invention, the method to calibrate the extender is only carried out once for one of the accelerometers and the extender settings are copied to the other accelerometers while the method to calibrate the damping circuit is carried out for each accelerometer.

In some of the above examples and embodiments a plurality of accelerometers have been described as being part of a measurement system. This includes many configurations of the measurement system. The plurality of accelerometers may measure all in the same direction (degree of freedom), but with respect to a different object or a different part of an object. However, the plurality of accelerometers may also measure in different directions, i.e. in different degrees of freedom, with respect to the same object. As an example, the measurement system may include one or more sensor housings to be used with different objects or different parts of the same object, wherein each sensor housing includes two or three accelerometers to measure in orthogonal degrees of freedom, and wherein the sensor housing includes respective electronic systems to extend the frequency response of the two or three accelerometers. The respective electronic systems may for instance be provided on the same circuit board and/or may share components for efficiency reasons, e.g. power supply, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An electronic system for an accelerometer having a piezoelectric element and a first mechanical resonance frequency, the electronic system comprising:
  a damping circuit configured to:
    receive an acceleration signal from the piezoelectric element;
    electronically dampen an amplitude of the first mechanical resonance frequency; and
    generate a damped acceleration signal; and
  an extender configured to:
    receive the damped acceleration signal;
    extend a frequency response;
    output an extended damped acceleration signal;
    have a first electronic anti-resonance frequency matching the damped first mechanical resonance frequency; and
    have the frequency response between the first electronic anti-resonance frequency and a higher second frequency that is substantially opposite to a corresponding frequency response of a combination of the accelerometer and the damping circuit.

2. The electronic system of claim 1, further including:
  an input configured to be connected to the piezoelectric element to receive the acceleration signal; and
  an output to output the extended damped acceleration signal.

3. The electronic system of claim 1, wherein:
  the damping circuit includes a resistor and an inductor configured to be connected in series with the piezoelectric element to form a resistor-inductor-capacitor circuit with a capacitance of the piezoelectric element, the inductor configured to be formed by a Gyrator circuit, and an electronic resonance frequency of the resistor-inductor-capacitor circuit is matched to the first mechanical resonance frequency.

4. The electronic system of claim 1, further comprising a sensor circuit configured to output a measurement signal representative of a voltage over the piezoelectric element or a charge stored in the piezoelectric element.

5. The electronic system of claim 1, wherein the damping circuit includes a feedback loop configured to apply a voltage to the piezoelectric element based on a measurement signal to dampen the amplitude of the first mechanical resonance frequency.

6. The electronic system of claim 1, wherein the extender includes one or more analog filters.

7. The electronic system of claim 1, wherein the extender includes one or more digital filers.

8. An accelerometer comprising a mass, a piezoelectric element connected to the mass, and an electronic system connected to the piezoelectric element, wherein the accelerometer has a first mechanical resonance frequency and the electronic system comprises:
a damping circuit configured to:
receive an acceleration signal from the piezoelectric element;
electronically dampen an amplitude of the first mechanical resonance frequency; and
generate a damped acceleration signal; and
an extender configured to:
receive the damped acceleration signal;
extend a frequency response;
output an extended damped accelerometer signal;
have a first electronic anti-resonance frequency matching the damped first mechanical resonance frequency; and
have the frequency response between the first electronic anti-resonance frequency and a higher second frequency that is substantially opposite to a corresponding frequency response of a combination of the accelerometer and the damping circuit.

9. A measurement system including an accelerometer comprising a mass, a piezoelectric element connected to the mass, and an electronic system connected to the piezoelectric element, the accelerometer having a first mechanical resonance frequency, the electronic system comprising:
a damping circuit configured to:
receive an acceleration signal from the piezoelectric element;
electronically dampen an amplitude of the first mechanical resonance frequency; and
generate a damped acceleration signal; and
an extender configured to:
receive the damped acceleration signal;
extend a frequency response;
output an extended damped accelerometer signal;
have a first electronic anti-resonance frequency matching the damped first mechanical resonance frequency; and
have the frequency response between the first electronic anti-resonance frequency and a higher second frequency that is substantially opposite to a corresponding frequency response of a combination of the accelerometer and the damping circuit.

10. The measurement system of claim 9, wherein:
the accelerometer is a first accelerometer,
the measurement system further comprises a second accelerometer comprising a mass, a piezoelectric element connected to the mass, and an electronic system connected to the piezoelectric element, the second accelerometer having a first mechanical resonance frequency, the electronic system comprising:
a damping circuit configured to:
receive an acceleration signal from the piezoelectric element;
electronically dampen an amplitude of the first mechanical resonance frequency; and
generate a damped acceleration signal; and
an extender configured to:
receive the damped acceleration signal;
extend a frequency response;
output an extended damped accelerometer signal;
have a first electronic anti-resonance frequency matching the damped first mechanical resonance frequency; and
have the frequency response between the first electronic anti-resonance frequency and a higher second frequency that is substantially opposite to a corresponding frequency response of a combination of the second accelerometer and the damping circuit,
wherein the first and second accelerometers substantially have the same mass, the same piezoelectric element, and a similar first mechanical resonance frequency,
wherein the electronic systems of the first and second accelerometers include an identical extender, and
wherein the damping circuits of the electronic systems of the first and second accelerometers have been tuned to the particular values of the first mechanical resonance frequency and its amplitude.

11. A lithographic apparatus comprising:
an actuation system configured to position an object;
a measurement system configured to measure a position quantity of the object; and
a control system configured to control the actuation system based on an output of the measurement system,
wherein the measurement system includes an accelerometer comprising a mass, a piezoelectric element connected to the mass, and an electronic system connected to the piezoelectric element, the accelerometer having a first mechanical resonance frequency, the electronic system comprising:
a damping circuit configured to:
receive an acceleration signal from the piezoelectric element;
electronically dampen an amplitude of the first mechanical resonance frequency; and
generate a damped acceleration signal; and
an extender configured to:
receive the damped acceleration signal;
extend a frequency response;
output an extended damped accelerometer signal;
have a first electronic anti-resonance frequency matching the damped first mechanical resonance frequency; and
have the frequency response between the first electronic anti-resonance frequency and a higher second frequency that is substantially opposite to a corresponding frequency response of a combination of the accelerometer and the damping circuit.

12. The lithographic apparatus of claim 11, further comprising:
an illumination system configured to condition a radiation beam;

a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the object is the support, the substrate table, or an element of the projection system.

13. A method comprising:
receiving an acceleration signal from an accelerometer having a piezoelectric element and a first mechanical resonance frequency;
electronically damping an amplitude of the first mechanical resonance frequency of the accelerometer with a damping circuit to generate a damped acceleration signal; and
extending a frequency response of the damped acceleration signal with an extender to generate an extended damped acceleration signal,
wherein a first electronic anti-resonance frequency of the damping circuit matches the damped first mechanical resonance frequency, and
wherein the frequency response between the first electronic anti-resonance frequency and a higher second frequency of the extender is substantially opposite to a corresponding frequency response of a combination of the accelerometer and the damping circuit.

14. The method of claim 13, further comprising:
measuring an actual frequency response of the damped acceleration signal;
comparing the actual frequency response with a desired frequency response;
based on an outcome of the comparing, determining values of extender settings to obtain the desired frequency response with the extended damped accelerometer signal; and
setting the extender settings to the determined values.

15. The method of claim 13, further comprising:
determining values for a resistor and an inductor of a resistor-inductor-capacitor circuit of the damping circuit to dampen the first mechanical resonance frequency to a desired level; and
setting the resistor and the inductor to the determined values.

* * * * *